US009329668B2

(12) United States Patent
Shor

(10) Patent No.: US 9,329,668 B2
(45) Date of Patent: May 3, 2016

(54) APPARATUS AND METHOD FOR SELECTIVELY DISABLING ONE OR MORE ANALOG CIRCUITS OF A PROCESSOR DURING A LOW POWER STATE OF THE PROCESSOR

(75) Inventor: Joseph Shor, Tel Mond (IL)

(73) Assignee: Intel Corporation, Santa Clara, CA (US)

( * ) Notice: Subject to any disclaimer, the term of this patent is extended or adjusted under 35 U.S.C. 154(b) by 251 days.

(21) Appl. No.: 13/976,415

(22) PCT Filed: Dec. 19, 2011

(86) PCT No.: PCT/US2011/065945
§ 371 (c)(1),
(2), (4) Date: Jun. 26, 2013

(87) PCT Pub. No.: WO2013/095351
PCT Pub. Date: Jun. 27, 2013

(65) Prior Publication Data
US 2013/0283082 A1    Oct. 24, 2013

(51) Int. Cl.
G06F 1/00    (2006.01)
G06F 1/32    (2006.01)
G06F 1/28    (2006.01)
H03K 17/30    (2006.01)
G06F 17/50    (2006.01)
G06F 1/26    (2006.01)

(52) U.S. Cl.
CPC ............... *G06F 1/3287* (2013.01); *G06F 1/28* (2013.01); *G06F 1/3206* (2013.01); *G06F 1/3296* (2013.01); *H03K 17/302* (2013.01); G06F 1/26 (2013.01); G06F 1/3203 (2013.01); G06F 17/5045 (2013.01); Y02B 60/1282 (2013.01); Y02B 60/1285 (2013.01); Y02B 60/32 (2013.01)

(58) Field of Classification Search
CPC ...... G06F 1/3287; G06F 1/26; G06F 17/5045; G06F 1/3203
See application file for complete search history.

(56) References Cited

U.S. PATENT DOCUMENTS

| 5,587,684 | A | 12/1996 | Salcedo |
| 5,808,377 | A | 9/1998 | Massie et al. |
| 5,818,299 | A | 10/1998 | Tran |
| 5,896,261 | A | 4/1999 | Black |

(Continued)

OTHER PUBLICATIONS

International Preliminary Report on Patentability for PCT Application No. PCT/US11/65945, dated Jul. 3, 2014.
TW Office Action for Taiwan Application No. 101143671, dated Jul. 28, 2014.

(Continued)

*Primary Examiner* — Xuxing Chen
(74) *Attorney, Agent, or Firm* — Schwabe, Williamson & Wyatt, P.C.

(57) ABSTRACT

A disable module may be coupled to an analog circuit of an electronic circuit. The disable module may detect an input voltage that is supplied to the analog circuit, and may disable (such as by powering off) the analog circuit if the input voltage is below a reference value. The reference value may be set at a voltage level at or below a maximum voltage that may be present across a transistor in the analog circuit. Accordingly, the analog circuit may be disabled without damage to the transistors of the analog circuit. The disable module may detect whether the input voltage is below the reference value level by comparing the input voltage to a reference voltage. The electronic circuit may include a voltage regulator, and the voltage regulator may include the analog circuit.

25 Claims, 6 Drawing Sheets

(56) References Cited

U.S. PATENT DOCUMENTS

| | | | |
|---|---|---|---|
| 7,349,190 B1 | 3/2008 | Maheedhar | |
| 8,909,948 B2 * | 12/2014 | Bansal | 713/300 |
| 2010/0138675 A1 * | 6/2010 | Nikazm et al. | 713/300 |
| 2010/0164469 A1 | 7/2010 | Bansal | |
| 2012/0079290 A1 * | 3/2012 | Kumar et al. | 713/300 |

OTHER PUBLICATIONS

International Search Report and Written Opinion for PCT/US2011/065945, mailed Sep. 3, 2012, 7 pages.

European Search Report for EP Application No. 11 87 7759; dated Jul. 21, 2015, 7 pages.

* cited by examiner

APPARATUS AND METHOD FOR SELECTIVELY DISABLING ONE OR MORE ANALOG CIRCUITS OF A PROCESSOR DURING A LOW POWER STATE OF THE PROCESSOR

CROSS REFERENCE TO RELATED APPLICATION

The present application is a national phase entry under 35 U.S.C. §371 of International Application No. PCT/US2011/065945, filed Dec. 19, 2011, entitled "APPARATUS AND METHOD FOR MANAGING POWER IN A COMPUTING SYSTEM," which designates, among the various States, the United States of America, and the entire contents and disclosures of which are hereby incorporated by reference in their entireties.

TECHNICAL FIELD

This disclosure relates generally to electronic circuits. More particularly but not exclusively, the present disclosure relates to apparatuses and methods for managing power in an electronic circuit.

BACKGROUND INFORMATION

Electronic circuits may have one or more low power states designed to reduce the power consumption of the electronic circuit. In the low power states, certain components of the electronic circuit that are not in use may be disabled and/or the supply voltage delivered to the components may be shut off or reduced. For example, the electronic circuit may have a first low power state, in which the supply voltage is reduced, and a second low power state in which the supply voltage is shut off (e.g., lowered to approximately zero). The electronic circuit consumes less power in the second low power state, but requires a longer time period (e.g., latency) to enter and exit the second low power state than the first low power state. Accordingly, in some situations, the electronic circuit may be able to enter the first low power state, but not able to enter the second low power state.

However, some circuit components include analog circuits that are still active during the first low power state. Some of these analog circuits are designed to be independent of the supply voltage, which enhances the circuit's performance but causes the circuit to consume current even at low supply voltages. Furthermore, the analog circuits are difficult to shut off, because shutting off the analog circuit may expose one or more transistors to a voltage drop that is greater than a maximum voltage, VMAX, that is permitted to be dropped across the transistor without damaging the transistor. The analog circuits may normally operate at a supply voltage that is higher than VMAX. Under normal operation of the analog circuit, current is always running, and the supply voltage is dropped across two or more transistors, so no transistor has a voltage drop across it of more than VMAX. However, if the analog circuit is shut off, one or more transistors may have a voltage drop across the transistor greater than VMAX.

BRIEF DESCRIPTION OF THE DRAWINGS

Non-limiting and non-exhaustive embodiments are described with reference to the following figures, wherein like reference numerals refer to like parts throughout the various views unless otherwise specified.

DETAILED DESCRIPTION

Figure 1:
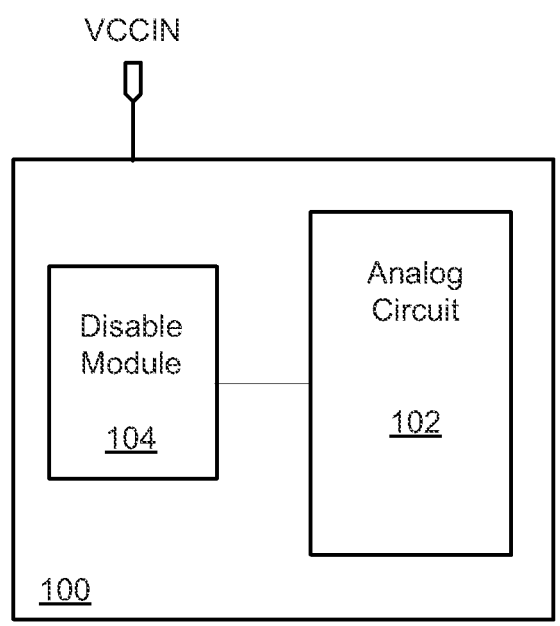
FIG. 1 is a block diagram that illustrates an electronic circuit including a disable module and an analog circuit, in accordance with various embodiments.

Embodiments of a method and apparatus to selectively disable one or more analog circuits are described herein. In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Various embodiments may provide an electronic circuit including a disable module coupled to an analog circuit. The analog circuit may receive an input voltage (e.g., a supply voltage), VCCIN. The electronic circuit may have an active state and one or more low power states including a first low power state. VCCIN may have a first voltage level during the active state, and may be lowered to a second voltage during the first low power state, with the second voltage being non-zero. The disable module may detect VCCIN, and may disable (e.g., power off) the analog circuit if VCCIN drops below a reference value (e.g., if or when the electronic circuit switches from the active state to the first low power state). The reference value may be set at a voltage level at or below a maximum voltage, VMAX, that may be permitted across a transistor in the analog circuit without causing damage to the analog circuit. Accordingly, the disable module may allow the analog circuit to be disabled during the first low power state without damage to the analog circuit.

In an embodiment, the disable module may detect whether the input voltage is below the threshold voltage level by comparing the input voltage to a reference voltage. In some embodiments, the electronic circuit may include an voltage regulator (e.g., an integrated voltage regulator), and the disable module may be used to disable one or more analog circuits in the voltage regulator during the first low power state.

In one embodiment, a power management apparatus may include an analog circuit configured to receive an input voltage, and a disable module coupled to the analog circuit, wherein the disable module is configured to detect if the input voltage is below a reference value, and to power off the analog circuit if the input voltage is below the reference value.

In one embodiment, the disable module may be configured to detect if the input voltage is below the reference value by comparison of the input voltage to a reference voltage having a voltage level equal to the reference value.

In one embodiment, the reference voltage may be used to supply power to one or more active components of the apparatus.

In one embodiment, a method for managing power may include receiving an input voltage, by an electronic circuit, the electronic circuit including an analog circuit; sensing that the input voltage is below a reference value; and powering off the analog circuit if the sensed input voltage is below the reference value.

In one embodiment, a processor may include a voltage regulator including an analog circuit configured to receive an input voltage; and a disable module coupled to the analog circuit, the disable module configured to detect if the input voltage is below a reference value, and to power off the analog circuit if the input voltage is below the reference value.

In one embodiment, a computing system may include a processor; a voltage regulator coupled to the processor, the voltage regulator including an analog circuit configured to receive an input voltage; a power supply configured to supply power to the processor through the voltage regulator; and a disable module coupled to the analog circuit, the disable module configured to detect if the input voltage is below a reference value, and to power off the analog circuit if the input voltage is below the reference value.

In one embodiment, the disable module may be integrated with the voltage regulator. In one embodiment, the voltage regulator may be integrated with the processor.

FIG. 1 illustrates an electronic circuit 100 in accordance with various embodiments. In some embodiments, the electronic circuit 100 may be referred to or embodied as a processor, chip and/or an integrated circuit. The electronic circuit 100 may include at least one analog circuit 102, and a disable module 104 coupled to the analog circuit 102. The disable module 104 may comprise a disable circuit in one embodiment. In some embodiments, the electronic circuit 100 may also include one or more digital circuits (not shown). The analog circuit 102 may receive an input voltage, VCCIN, to power the analog circuit 102. In some embodiments, VCCIN may be supplied to the electronic circuit 100 by an external voltage regulator (not shown).

In various embodiments, VCCIN may have a first voltage level during active operation of the electronic circuit 100. The electronic circuit 100 may have one or more low power states (also referred to as "C-states") in which one or more components of the electronic circuit 100 are shut off and/or VCCIN is lowered. In a first low power state, VCCIN may be lowered (e.g., by the external voltage regulator) from the first voltage level to a second voltage level, with the second voltage level being non-zero. In various embodiments, the disable module 104 may receive VCCIN, and detect if VCCIN is below a reference value (e.g., if or when the electronic circuit 100 enters the first low power state). The disable module 104 may power off the analog circuit 102 if VCCIN is below the reference value. The analog circuit 102 may be powered back on if VCCIN rises above the reference value. In some embodiments, the analog circuit 102 may be powered off if VCCIN is equal to the reference value. In other embodiments, the analog circuit 102 may be powered on if VCCIN is equal to the reference value.

In various embodiments, the analog circuit 102 may include a plurality of transistors. The first voltage level of VCCIN (during active operation of electronic circuit 100) may be above a maximum voltage, VMAX, that is permitted to be dropped across one of the transistors (e.g., gate-source voltage (Vgs), drain-source voltage (Vds), and/or gate-drain voltage (Vgd)) without causing damage and/or degradation to the transistor. VMAX may depend on the transistor process used. For example, in one example embodiment, VMAX may be about 1 to about 1.1 Volt (V) and the first voltage level may be from about 1.7V to about 2.0V. The second voltage level (the voltage during the first low power state) may be about 1 V or less.

If the analog circuit 102 is powered on, there may be current constantly flowing in the analog circuit 102, and VCCIN may be dropped or otherwise applied over two or more transistors, which allows the analog circuit 102 to operate at VCCIN. However, if the analog circuit 102 is shut off and there is no current flowing, one or more of the transistors in the analog circuit 102 may have a voltage drop across it of greater than VMAX, potentially causing damage to the analog circuit 102.

Thus, in one embodiment, VCCIN is lowered below VMAX before the analog circuit 102 may be shut off. The reference value (the voltage level of VCCIN below which the disable module 104 powers down the analog circuit 102) may have a value equal to or less than VMAX. Accordingly, the disable module 104 detects VCCIN and powers down the analog circuit 102 if VCCIN is lowered to a safe level (e.g., below VMAX) for the analog circuit 102. The analog circuit 102 is powered back on if VCCIN rises above the reference value.

In some embodiments, the electronic circuit 100 may include a second low power state, in which VCCIN is lowered to an approximately zero voltage. The analog circuit 102 may shut off if VCCIN is lowered to zero voltage. However, the latency of the second low power state may be significantly longer than the latency of the first low power state. This is because the time spent to lower VCCIN from the first voltage level to zero voltage and then raise VCCIN back from zero voltage to the first voltage level (as is performed to enter and exit the second low power state), may be significantly longer than the time used to lower VCCIN from the first voltage level to the second voltage level and then raise VCCIN from the second voltage level back to the first voltage level (as is performed to enter and exit the first low power state). Accordingly, in some situations, the electronic circuit 100 may have sufficient time to enter the first low power state, but not enough time to enter the second low power state. The disable module 104 described herein may reduce the power consumption of the electronic circuit 100 during the first low power state, while maintaining a relatively short latency of the first low power state since VCCIN is not lowered all the way to zero voltage.

Figure 2:
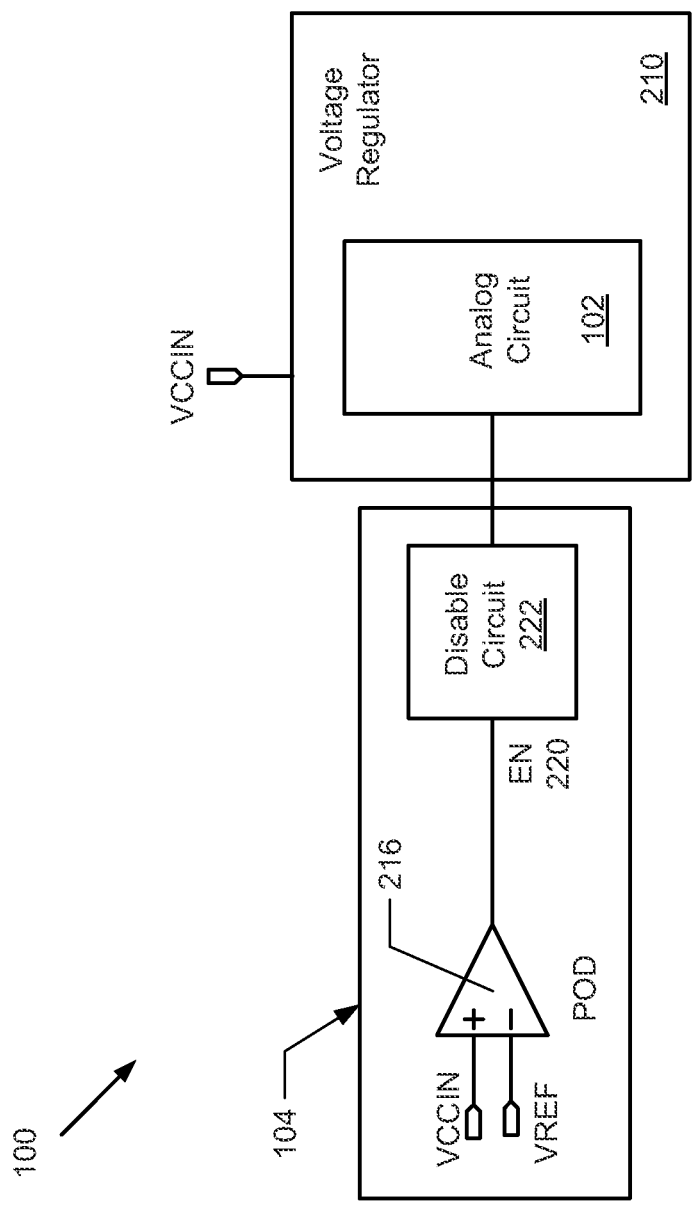
FIG. 2 illustrates an example of one embodiment of the electronic circuit of FIG. 1.

FIG. 2 shows an example embodiment of the electronic circuit 100 of FIG. 1. As shown in FIG. 2, an embodiment of the electronic circuit 100 may include a voltage regulator (VR) 210 that includes one or more analog circuits 102. For example, analog circuit 102 may include a band-gap reference circuit, a pulse width modulator, a current sensor, a linear voltage regulator, a compensator, and/or other circuit device(s). In some embodiments, the voltage regulator 210 may be integrated into a processor. Some embodiments of the electronic circuit 100 may include a plurality of voltage regulators 210, such as about six to ten voltage regulators 210. The disable module 104 may be coupled to the voltage regulator 210. In embodiments with a plurality of voltage regulators 210, the disable module 104 may be coupled to more than one voltage regulator 210 and/or one or more voltage regulators 210 may be coupled to separate disable modules 104.

The disable module 104 may include a power-on-detector (POD) 216 and a disable circuit 222. POD 216 may detect VCCIN, and may trigger the disable circuit 222 to power off the analog circuit 102 if VCCIN drops below a reference value.

As shown in FIG. 2, the POD 216 may detect that VCCIN is below the reference value by comparing VCCIN to a reference voltage, VREF, that has a value that is approximately equal to the reference value. In some embodiments, VREF may be a supply voltage used to power other components of the electronic circuit 100 that are active during the first low power state. For example, in some embodiments, the electronic circuit 100 may include a low power rail called VCC sustain (VCCST) to power a set of static random access memory (SRAM) to retain the state of the chip during the low power states. In some embodiments, VCCST may be about 1V. VCCST may be used as VREF and directly compared to VCCIN. In other embodiments, VREF may be derived from another voltage present in or applied on the electronic circuit 100, and the voltage level to be used for VREF may be adjusted, such as with a voltage divider (e.g., a resistive voltage divider). For example, VREF may be derived from a turn-on voltage of a transistor in the electronic circuit 100.

Figure 3:
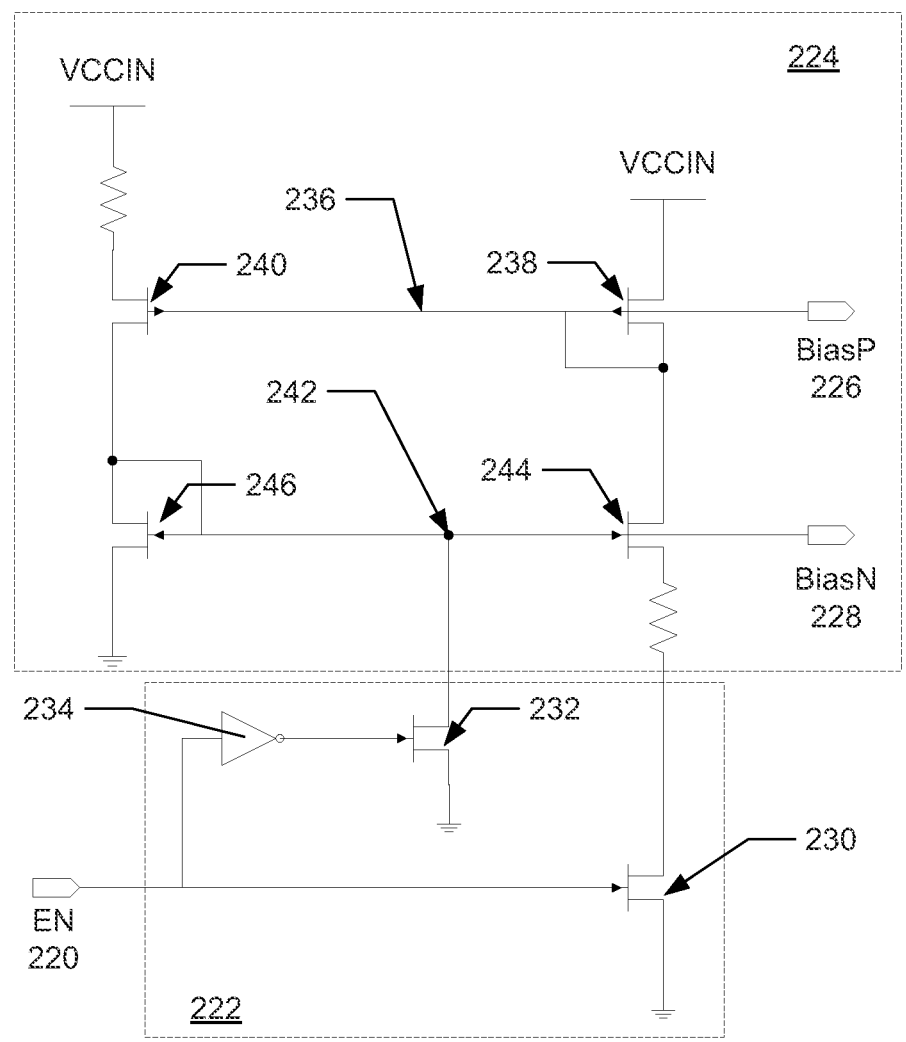
FIG. 3 illustrates an example of one embodiment of the disable module for the electronic circuit shown in FIG. 2, with the disable circuit coupled to a bias circuit of the analog circuit.

POD 216 may output a digital control signal 220 (labeled as Enable signal, EN) that is used to control disabling and/or enabling of the analog circuit 102. In some embodiments, the POD 216 may include a buffer to convert an analog output signal to the digital control signal 220. The control signal 220 may have a first logic state (e.g., high value or logic 1) if VCCIN is equal to or less than VREF and a second logic state (e.g., low value or logic 0) if VCCIN is greater than VREF. In other embodiments, these outputs may be reversed or may follow a different protocol. Control signal 220 may be sent to the disable circuit 222 (an example of which is shown in FIG. 3 and discussed below) coupled to the analog circuit 102. The disable circuit 222 may power off the analog circuit 102 if the control signal 220 switches from the second logic state to the first logic state.

FIG. 3 shows an example embodiment of disable circuit 222, in which disable circuit 222 is coupled to a bias circuit 224 of analog circuit 102 of FIG. 2. Bias circuit 224 may produce bias voltages BiasP 226 and BiasN 228. The currents in analog circuit 102 may be derived from bias voltages 226 and 228. Disable circuit 222, as shown in FIG. 3, may choke the bias circuit 224 (e.g., cut off or otherwise reduce the current in the bias circuit 224) if the control signal 220 switches from the second logic state to the first logic state. In one embodiment, the control signal 220 may be at a voltage level of VREF. Accordingly, the disable circuit 222 may operate at the VREF voltage.

Disable circuit 222 may include n-type transistors 230 and 232, and an inverter 234. Disable circuit 222 may receive the control signal 220 (labeled as enable signal EN), and feed the control signal 220 directly to the gate of transistor 230. An inversion of control signal 220 (after being inverted by inverter 234) may be fed to the gate of transistor 232. If the control signal 220 is a logic 1 (e.g., if VCCIN is greater than VREF), transistor 230 is on and transistor 232 is off, thereby allowing normal operation of bias circuit 224. In normal operation, current is flowing in the bias circuit 224, and the voltage at node 236 between the gates of p-type transistors 238 and 240 will be at VCCIN-VTP or lower, where VTP is the turn-on voltage of the p-type transistors 238 and 240. The voltage at a node 242 between the gates of n-type transistors 244 and 246 will be VTN (the turn-on voltage of the n-type transistors) or higher above ground.

If the control signal 220 switches to a logic 0 (e.g., if VCCIN is equal to or less than VREF), transistor 230 turns off and transistor 232 turns on. This causes the voltage at node 236 to rise to VCCIN and the voltage at node 242 to drop to ground, thereby turning off transistors 238, 240, 244, and 246 and preventing flow of current in the bias circuit 224. This shuts off the remainder of analog circuit 102, since the currents in analog circuit 102 are derived from the bias currents 226 and 228 of bias circuit 224. This process is referred to as "choking" the bias of the analog circuit 102.

If VCCIN rises above VREF (e.g., if the electronic circuit 100 exits the first low power state), the control signal 220 switches back to a logic 1. A startup circuit (not shown), may provide a current to the bias circuit 224 to activate the current in the bias circuit 224. In some embodiments, the startup circuit may be a pulse generator. The startup circuit may be triggered by the control signal 220. If the control signal switches from logic 1 to logic 0, the startup circuit may be prevented from operating, and the disable circuit 222 may choke the bias as described above. If the control signal switches from logic 0 to logic 1, the startup circuit may be triggered to activate current in the bias circuit 224, and the disable circuit 222 allows normal operation of bias circuit 224.

It will be apparent that in other embodiments, the first logic state may be a logic 1 and the second logic state may be a logic 0. The disable circuit 222 and/or startup circuit may be modified accordingly, including selecting the appropriate p-type or n-type transistors and coupling them accordingly in order to produce the appropriate logical switching, inputs, outputs, etc.

As discussed above, in some embodiments, the voltage regulator 210 may include a plurality of analog circuits 102. In some embodiments, multiple analog circuits 102 may be coupled to a central bias circuit, and so choking the central bias circuit may disable the multiple analog circuits 102. Alternatively, or additionally, each analog circuit 102 may be coupled to a separate disable circuit 222. The disable circuits 222 may be triggered by the same POD 216 or separate PODs 216.

Figure 4:
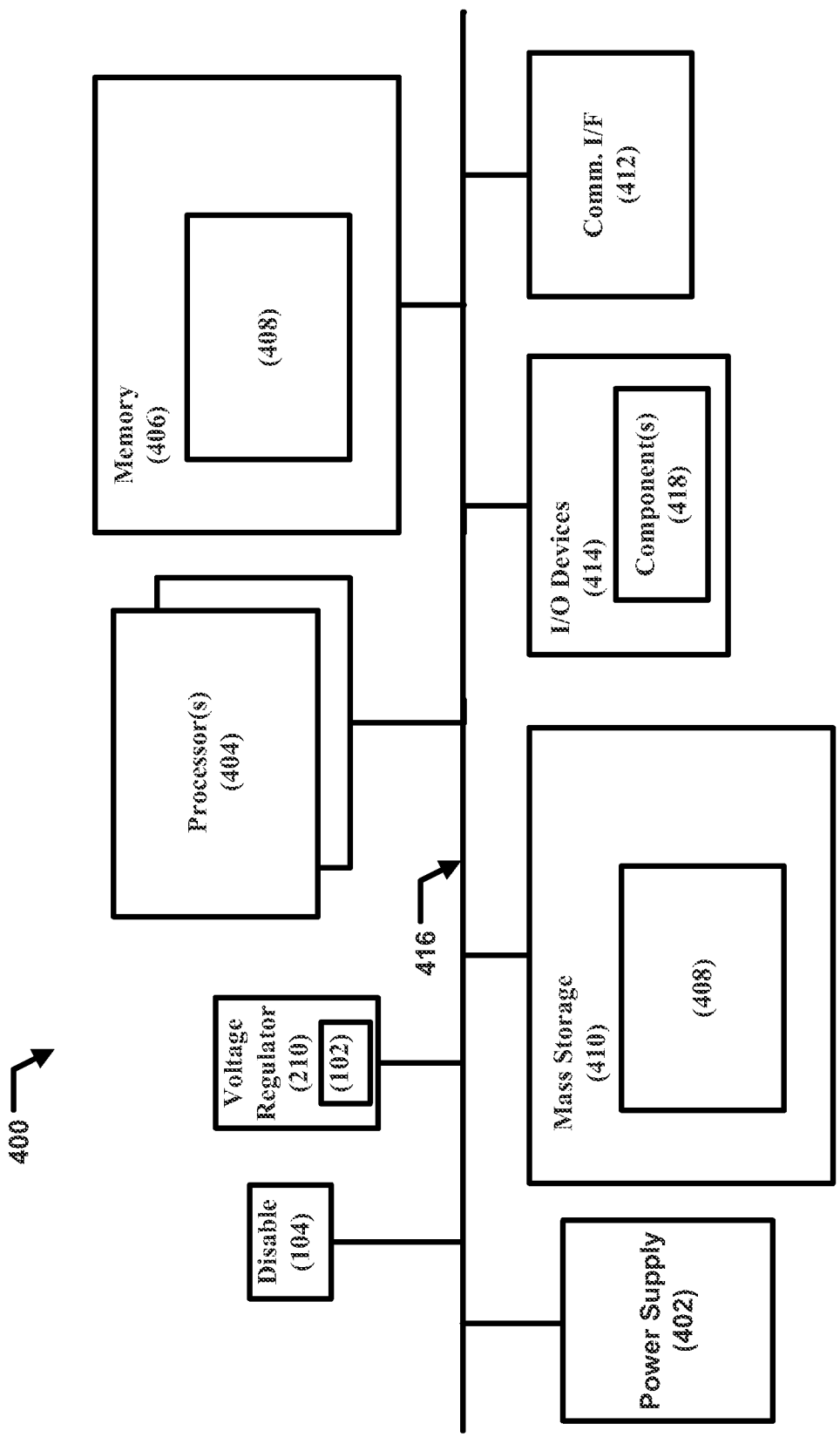
FIG. 4 is a block diagram that illustrates an example computer system suitable to practice the disclosed embodiments.

Embodiments of the disable circuit described herein may be used in a number of implementations and applications. For example, mobile devices, including but not limited to smart phones, nettops, tablets and other Mobile Internet Devices (MIDs), are designed with low-power states. Also, microprocessors have low power states that may use disable modules and/or techniques to prevent certain analog circuits or elements thereof from unnecessarily consuming power. FIG. 4 is a block diagram that illustrates an example computer system 400 suitable to practice the disclosed disable circuit/method of various embodiments.

As shown, the computer system 400 may include a power supply unit 402, a number of processors or processor cores 404, a system memory 406 having processor-readable and processor-executable instructions 408 stored therein, a mass storage device 410 that may also store the instructions 408, and a communication interface 412. For the purpose of this application, including the claims, the terms "processor" and "processor cores" may be considered synonymous, unless the context clearly requires otherwise.

The one or more mass storage devices 410 and/or the memory 406 may comprise a tangible, non-transitory computer-readable storage device (such as a diskette, hard drive, compact disc read only memory (CDROM), hardware storage unit, and so forth). The computer system 400 may also comprise input/output devices 414 (such as a keyboard, display screen, cursor control, and so forth). According to various embodiments, one or more of the depicted components of the system 400 and/or other element(s) may include a keyboard, LCD screen, non-volatile memory port, multiple antennas, graphics processor, application processor, speakers, or other associated mobile device elements, including a camera.

In various embodiments, at least one processor 404 and/or other component(s) 418 may include an electronic circuit (such as the electronic circuit 100 of FIG. 1 and FIG. 2) having a disable module 104 to selectively disable one or more analog circuits 102 of the processor 404 and/or other component(s) 418 during a low power state of the processor 404. Such component(s) 418 may alternatively or additionally be located elsewhere in the computer system 400, and may comprise part or all of an integrated circuit.

In some embodiments, the system 400 may include a voltage regulator 210. The voltage regulator may include one or more analog circuits 102. The disable module 104 may selectively disable the one or more analog circuits 102 (e.g., during a low power state of the processor 404). The voltage regulator 210 and/or disable module 104 may be integrated within processor 404 and/or separate from processor 404. Additionally, the disable module 104 may be an integrated component of the voltage regulator 210 or a separate component from the voltage regulator 210.

The various elements of FIG. 4 may be coupled to each other via a system bus 416, which represents one or more buses. In the case of multiple buses, they may be bridged by one or more bus bridges (not shown). Data may pass through the system bus 416 through the I/O devices 414, for example, between the component(s) 418 and the processors 404.

The system memory 406 and the mass storage device 410 may be employed to store a working copy and a permanent copy of the programming instructions implementing one or more operating systems, firmware modules or drivers, applications, and so forth, herein collectively denoted as 408. The permanent copy of the programming instructions may be placed into permanent storage in the factory, or in the field, through, for example, a distribution medium (not shown), such as a compact disc (CD), or through the communication interface 412 (from a distribution server (not shown)).

The remaining constitution of the various elements of the computer system 400 is known, and accordingly will not be further described in detail.

Figure 5:
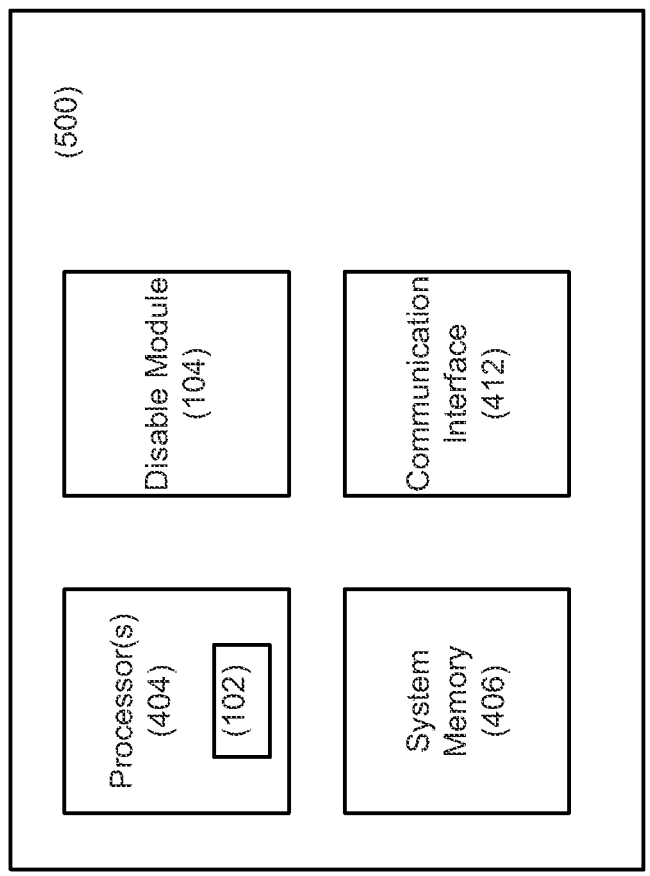
FIG. 5 is a block diagram that illustrates an example System-on-Chip suitable to practice the disclosed embodiments.

In some embodiments, at least one of the processor(s) 404 and the disable module 104 may be integrated on the same die with one or more other components of system 400. For example, at least one of the processor(s) 404 may be integrated on the same die with one or more other components of system 400 to form a System on Chip (SoC) 500, as shown in FIG. 5. SoC 500 may include one or more processors 404, the disable module 104, system memory 406, and/or communication interface 412. The disable module 104 may selectively disable one or more analog circuits 102 of the SoC 500. In some embodiments, the one or more analog circuits may be included in the processor(s) 404. Other embodiments of the SoC 500 may include more or less components than are shown in FIG. 5.

In some embodiments, at least one of the processor(s) 404 and the disable module 104 may be packaged together with one or more other components of system 400. For example, at least one of the processor(s) 404 may be packaged together with one or more other components of system 400 to form a System in Package (SiP).

Figure 6:
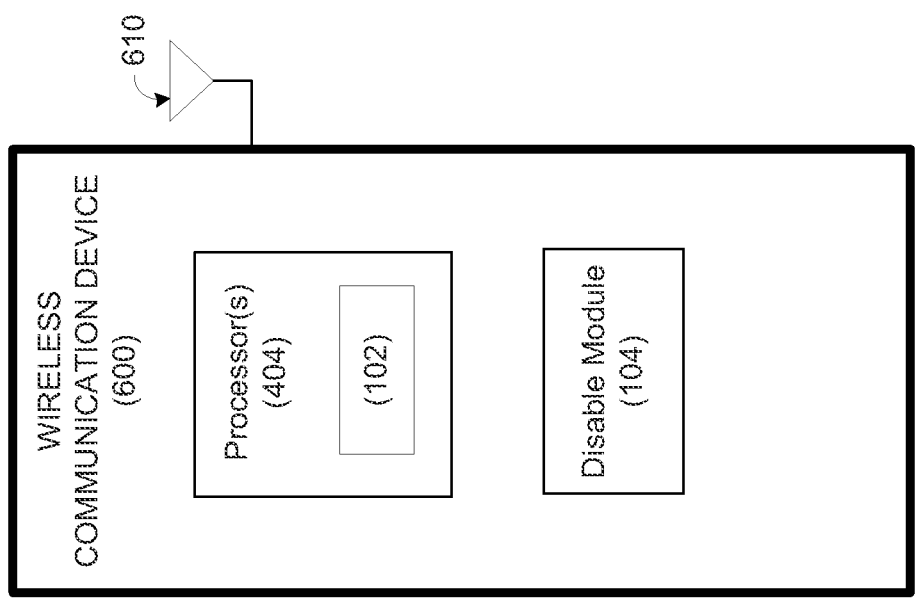
FIG. 6 is a block diagram that illustrates an example wireless communication device suitable to practice the disclosed embodiments.

In some embodiments, the disable module 104 may be included in a wireless communication device 600, as shown in FIG. 6. The wireless communication device may include one or more processors 404 and/or other components of system 400. In some embodiments, the wireless communication device may include a SoC (such as SoC 500) which includes the one or more processors 404. The disable module 104 may selectively disable one or more analog circuits 102. In some embodiments, the analog circuits 102 may be included in the processor(s) 404 (e.g., during a low power state of the processor(s) 404).

The wireless communication device 600 may communicate (e.g., transmit and/or receive) over a wireless communication network using one or more antennas 610. For example, the wireless communication device 600 may be a mobile phone, smart phone, tablet, personal computer (e.g., desktop computer, laptop computer), set-top box, game console, base station, and/or any other device adapted to transmit and/or receive a wireless communication signal.

The above description of illustrated embodiments, including what is described in the Abstract, is not intended to be exhaustive or to be limited to the precise forms disclosed. While specific embodiments and examples are described herein for illustrative purposes, various modifications are possible. For example, the configuration and connection of certain elements in various embodiments have been described above in the context of high/low values of signals, responses to rising/falling edges of signals, inverters to invert signals, P-type and N-type transistors, and so forth. In other embodiments, different configurations can be provided in view of whether N-type transistors are used instead of P-type transistors, whether or not certain signals are inverted, whether certain changes in state are triggered in response to falling edges instead of rising edges or vice versa, and so forth.

These and other modifications can be made in light of the above detailed description. The terms used in the following claims should not be construed to be limited to the specific embodiments disclosed in the specification.

What is claimed is:

1. A power management apparatus, comprising:
an analog circuit to receive an input voltage;
a bias circuit coupled to the analog circuit, the bias circuit to provide at least one bias output to the analog circuit; and
a disable circuit coupled to the analog circuit and the bias circuit, the disable circuit to detect if the input voltage is below a reference value, and to reduce current flow in the bias circuit if the input voltage is below the reference value, wherein the analog circuit is to power off based on an output voltage of the at least one bias output associated with the reduced current flow of the bias circuit.

2. The apparatus of claim 1, wherein the disable circuit is to detect if the input voltage is below the reference value by comparison of the input voltage to a reference voltage having a voltage level equal to the reference value.

3. The apparatus of claim 2, wherein the reference voltage is used to supply power to one or more active components of the apparatus.

4. The apparatus of claim 1, wherein the input voltage is lowered from a first voltage to a second voltage during a low power state of the apparatus, the first voltage being greater than the reference value and the second voltage being less than the reference value level and non-zero.

5. The apparatus of claim 1, further comprising an integrated voltage regulator, wherein the integrated voltage regulator includes the analog circuit.

6. The apparatus of claim 5, wherein the analog circuit comprises a band-gap reference circuit.

7. The apparatus of claim 1, further comprising a power-on-detector (POD) coupled to the disable circuit, the POD to detect the input voltage and to send a control signal to the disable circuit, the control signal having a first logic state if the input voltage is below the reference value and a second logic state if the input voltage is above the reference value, the disable circuit to reduce the current flow in the bias circuit if the control signal switches from the second logic state to the first logic state.

8. The apparatus of claim 7, further comprising a startup circuit coupled to the analog circuit, the startup circuit to power on the analog circuit if the control signal switches from the first logic state to the second logic state.

9. The apparatus of claim 1, wherein the reference value is equal to or less than a maximum voltage permitted to be dropped across a transistor of the analog circuit.

10. The apparatus of claim 1, wherein the at least one bias output includes a first bias output and a second bias output, the first bias output having a voltage substantially equal to the input voltage if the input voltage is below the reference value and the second bias output having a voltage substantially equal to ground if the input voltage is below the reference value.

11. A method for managing power comprising:
receiving an input voltage, by an electronic circuit, the electronic circuit including an analog circuit;
sensing that the input voltage is below a reference value;
reducing a current flow in a bias circuit coupled to the analog circuit in response to sensing that the input voltage is below the reference value, wherein the bias circuit provides a bias output signal to the analog circuit; and
powering off the analog circuit via a change in voltage of the bias output signal resulting from the reduced current flow in the bias circuit.

12. The method of claim 11, wherein the reference value is equal to or less than a maximum voltage permitted to be dropped across a transistor of the analog circuit.

13. The method of claim 11, wherein the sensing comprises comparing the input voltage to a reference voltage having a voltage level equal to the reference value.

14. The method of claim 13, wherein the reference voltage comprises a supply voltage used to power active components of the electronic circuit.

15. A processor, comprising:
a voltage regulator including an analog circuit to receive an input voltage;
a bias circuit coupled to the analog circuit, the bias circuit to output a bias output signal to the analog circuit; and
a disable circuit coupled to the analog circuit and the bias circuit, the disable circuit to detect if the input voltage is below a reference value, to reduce a flow of current in the bias circuit in response to detection that the input voltage is below the reference value and to power off the analog circuit through a change in an output voltage of an output from the bias circuit, the output from the bias circuit input to the analog circuit, that occurs in response to reduction of the flow of current in the bias circuit.

16. The processor of claim 15, wherein the processor has an active state, in which the input voltage has a first voltage level above the reference value, and a low power state, in which the input voltage has a second voltage level below the reference value.

17. The processor of claim 16, further comprising a startup circuit coupled to the analog circuit, the startup circuit to power on the analog circuit if the processor switches from the low power state to the active state.

18. The processor of claim 15, wherein the disable circuit is to detect if the input voltage is below the reference value by comparing the input voltage to a reference voltage having a voltage level equal to the reference value, wherein the reference voltage is used to supply power to one or more active components of the processor that are active during a low power state of the processor.

19. The processor of claim 18, wherein the voltage regulator comprises a first voltage regulator, and further comprising a plurality of voltage regulators including the first voltage regulator, wherein one or more analog circuits in each voltage regulator are powered off if the processor switches from the active state to the low power state.

20. A computing system comprising:
a processor;
a voltage regulator coupled to the processor, the voltage regulator including an analog circuit to receive an input voltage;
a power supply to supply power to the processor through the voltage regulator;
a bias circuit coupled to the analog circuit, the bias circuit providing as least one bias output to the analog circuit; and
a disable circuit coupled to the analog circuit and the bias circuit, the disable circuit to detect if the input voltage is below a reference value, and to reduce current flow within the bias circuit if the input voltage is below the reference value, wherein the analog circuit is to power off based on a voltage level of the at least one bias output associated with the reduced current flow within the bias circuit.

21. The system of claim 20, wherein the disable circuit is integrated with the voltage regulator.

22. The system of claim 20, wherein the voltage regulator is integrated with the processor.

23. The system of claim 20, wherein the disable circuit is to detect if the input voltage is below the reference value by comparing the input voltage to a reference voltage having a voltage level equal to the reference value.

24. The system of claim 20, wherein the processor has an active state, in which the input voltage has a first voltage level above the reference value, and a low power state, in which the input voltage has a second voltage level below the reference value.

25. The system of claim 24, wherein the reference voltage is used to supply power to one or more active components of the processor that are active during the low power state.

* * * * *

UNITED STATES PATENT AND TRADEMARK OFFICE
CERTIFICATE OF CORRECTION

PATENT NO. : 9,329,668 B2  
APPLICATION NO. : 13/976415  
DATED : May 3, 2016  
INVENTOR(S) : Joseph Shor Page 1 of 1

It is certified that error appears in the above-identified patent and that said Letters Patent is hereby corrected as shown below:

In the Claims  
Column 10  
Line 33, "providing as least one" should read -- providing at least one --

Signed and Sealed this  
Nineteenth Day of July, 2016

Michelle K. Lee  
*Director of the United States Patent and Trademark Office*